US007646601B2

United States Patent
Zhang et al.

(10) Patent No.: US 7,646,601 B2
(45) Date of Patent: Jan. 12, 2010

(54) SERVER CHASSIS WITH AIR FLAP APPARATUS

(75) Inventors: Jun-Xiong Zhang, Shenzhen (CN); Lie-Guo Pang, Shenzhen (CN)

(73) Assignees: Hong Fu Jin Precision Industry (ShenZhen) Co., Ltd., Shenzhen City, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/046,459

(22) Filed: Mar. 12, 2008

(65) Prior Publication Data
US 2009/0147452 A1 Jun. 11, 2009

(30) Foreign Application Priority Data
Dec. 7, 2007 (CN) .................. 2007 1 0202932

(51) Int. Cl.
*H05K 7/20* (2006.01)
(52) U.S. Cl. .................. 361/695; 361/690; 361/724; 454/184; 174/17 R
(58) Field of Classification Search ............. 361/679, 361/679.01, 679.48, 690–697, 724–728, 361/730, 752, 818; 174/50, 17 VA, 480, 174/481, 17 R, 53, 56–58, 67, 559; 312/106–108, 312/223.2, 223.3, 308, 310, 321.5, 351.2, 312/336, 362; 454/184
See application file for complete search history.

(56) References Cited

U.S. PATENT DOCUMENTS

| 4,833,554 | A | * | 5/1989 | Dalziel et al. ............. 360/98.04 |
| 6,052,281 | A | * | 4/2000 | Hardt et al. .................. 361/690 |
| 6,058,011 | A | * | 5/2000 | Hardt et al. .................. 361/694 |
| 6,542,363 | B2 | * | 4/2003 | White ......................... 361/695 |
| 6,654,251 | B2 | * | 11/2003 | Yun ............................ 361/724 |
| 6,710,240 | B1 | * | 3/2004 | Chen et al. .............. 174/17 VA |
| 6,771,499 | B2 | * | 8/2004 | Crippen et al. ......... 361/679.48 |
| 6,980,435 | B2 | * | 12/2005 | Shum et al. ................. 361/695 |
| 7,307,832 | B1 | * | 12/2007 | Lewis .................... 361/679.01 |
| 7,344,439 | B2 | * | 3/2008 | Henry et al. ................ 454/184 |
| 7,367,638 | B2 | * | 5/2008 | Marroquin et al. .......... 312/322 |
| 7,432,441 | B2 | * | 10/2008 | Liang .......................... 174/50 |
| 7,508,683 | B1 | * | 3/2009 | Jochym et al. .............. 361/818 |

* cited by examiner

Primary Examiner—Michael V Datskovskiy
(74) Attorney, Agent, or Firm—Frank R. Niranjan (57) ABSTRACT

A server chassis is provided for receiving a functional module therein. The server chassis includes a base with an opening defined in an end thereof for the functional module inserted therethrough, and an air flap apparatus engaging with the base. The air flap apparatus includes a shielding panel pivotably attached to the base, and a resilient member connected to the base and the shielding panel to urge movement of the shielding panel.

8 Claims, 9 Drawing Sheets

SERVER CHASSIS WITH AIR FLAP APPARATUS

BACKGROUND

1. Field of the Invention

The present invention relates to server chassis, and more particularly to a server chassis with an air flap apparatus for preventing air outside the server chassis from flowing into the chassis to interfere with the normal air flow therein.

2. Description of Related Art

Generally, an opening is defined at one end of a server chassis via which a functional module is inserted into or drawn out of the server chassis. When the functional module is removed from the chassis, the corresponding opening of the chassis should be shielded, otherwise the air outside the server chassis flows in to interfere with the normal airflow in the sever chassis and possibly impair heat dissipation in the server. A shielding apparatus is typically attached to the chassis by multiple screws, it makes the installation and detachment of the shielding apparatus tedious.

What is desired, therefore, is a server chassis with an air flap apparatus conveniently shielding or exposing an opening in the server chassis.

SUMMARY

An exemplary server chassis is provided for receiving a functional module therein. The server chassis includes a base with an opening defined in an end thereof for the functional module inserted therethrough, and an air flap apparatus engaging with the base. The air flap apparatus includes a shielding panel pivotably attached to the base, and a resilient member connected to the base and the shielding panel to urge movement of the shielding panel.

Other advantages and novel features of the present invention will become more apparent from the following detailed description of embodiment when taken in conjunction with the accompanying drawings, in which:

DETAILED DESCRIPTION

Figure 1:
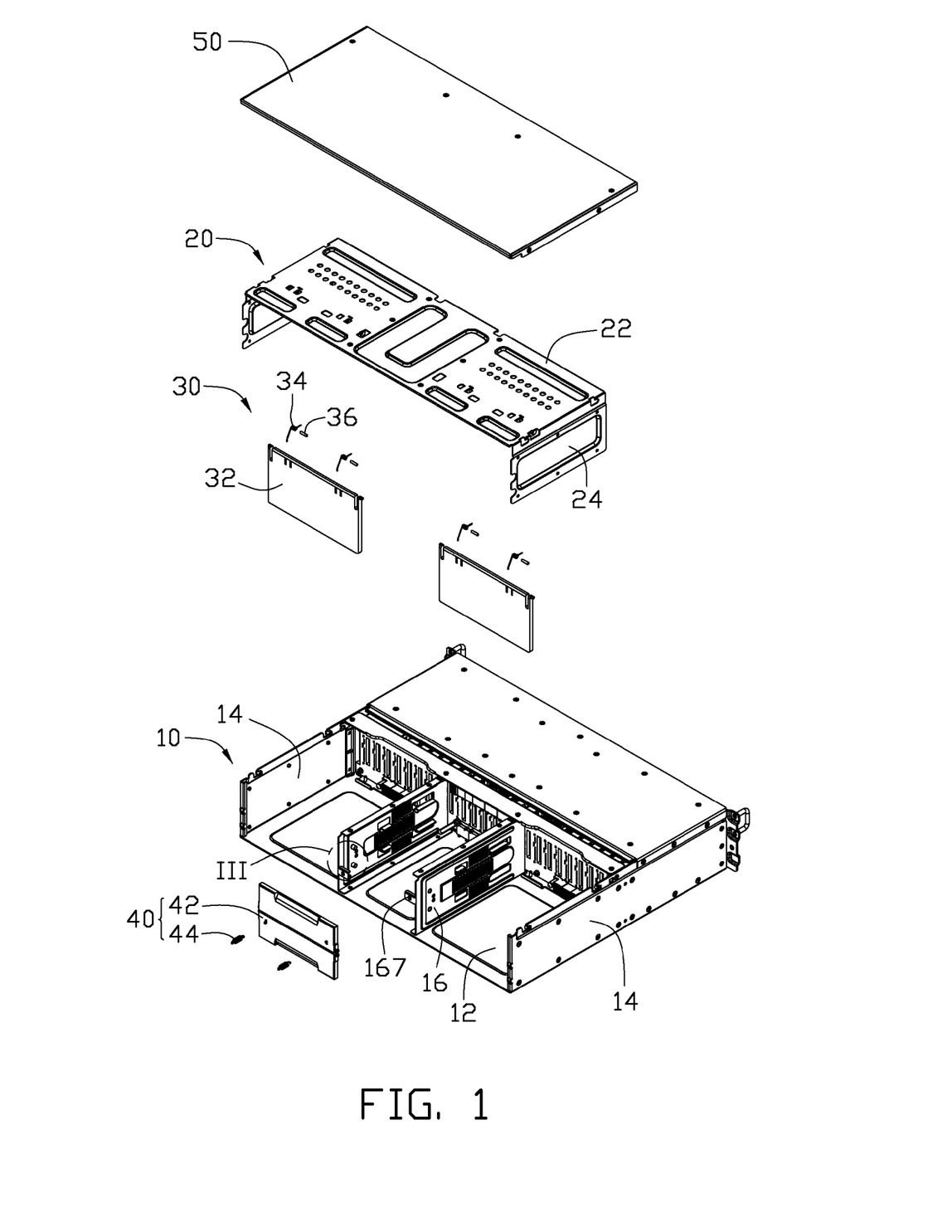
FIG. 1 is an exploded, isometric view of a server chassis in accordance with an embodiment of the present invention, the sever chassis including a mounting bracket, a pair of first air flap apparatuses, and a pair of second air flap apparatuses.
Figure 2:
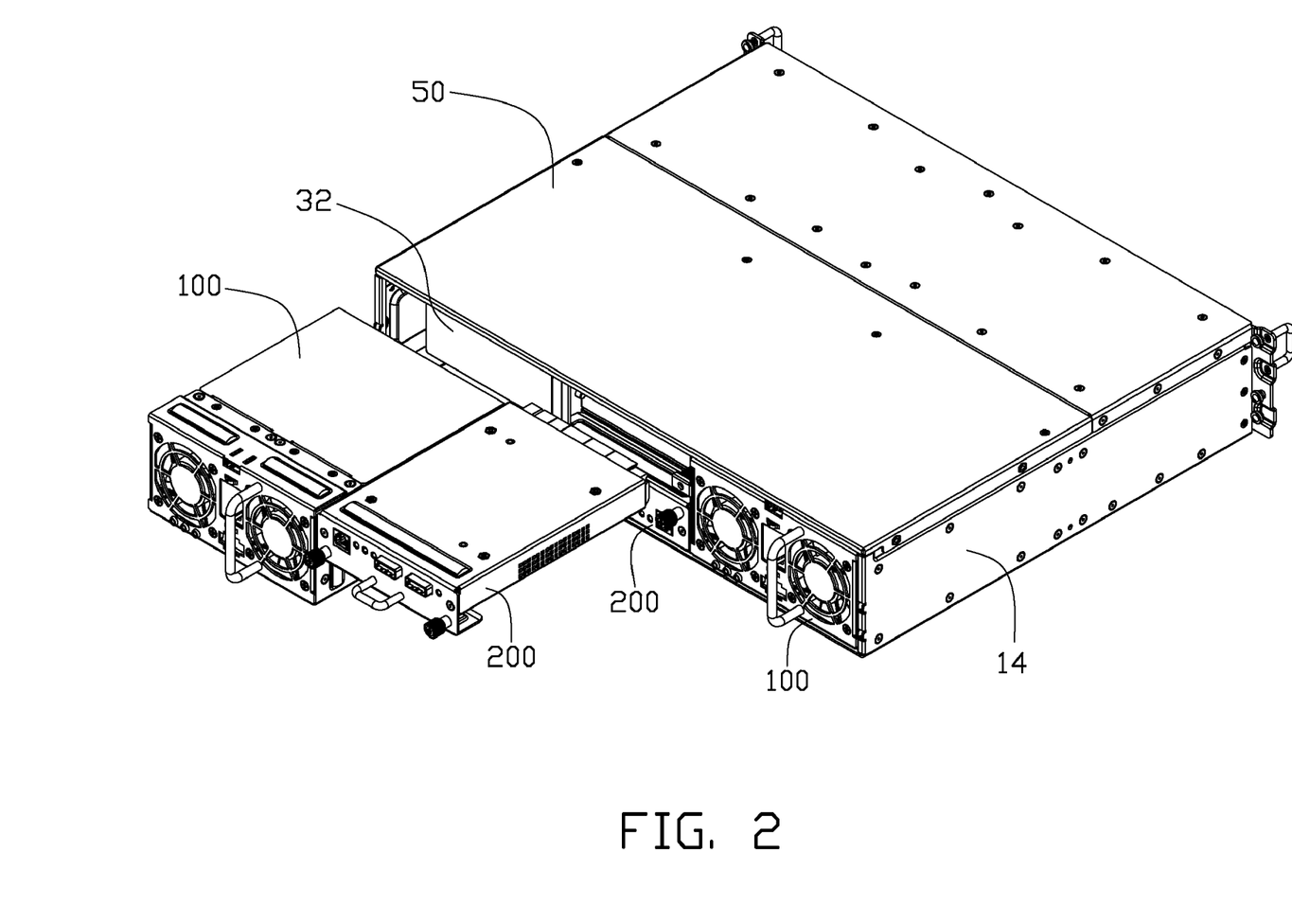
FIG. 2 is assembled view of the server chassis of FIG. 1 together with first and second functional modules.

Referring to FIGS. 1 and 2, a server chassis in accordance with an embodiment of the present invention is provided for receiving a pair of first functional modules 100 and a pair of second functional modules 200 via openings defined in a rear end thereof. The server chassis includes a base 10, a mounting bracket 20, a pair of first air flap apparatuses 30, a pair of second air flap apparatuses 40, and a cover 50.

Figure 3:
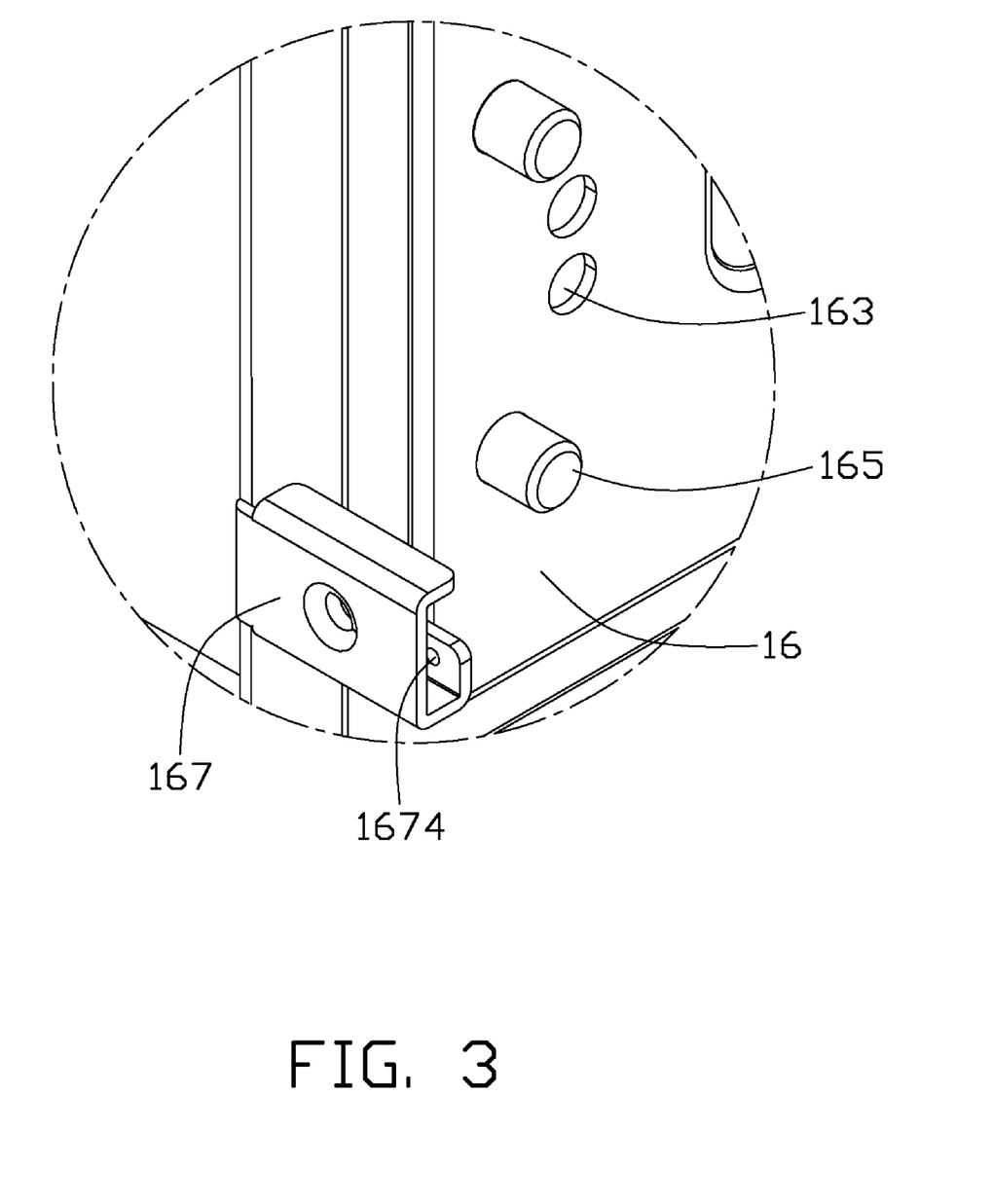
FIG. 3 is an enlarged view of an encircled portion III of FIG. 1.

Referring also to FIG. 3, the base 10 includes a bottom panel 12, a pair of parallel side panels 14 vertically extending upward from opposite side edges of the bottom panel 12 respectively, and a pair of parallel partitioning panels 16 vertically extending upward from bottom panel 12. Each of the partitioning panels 16 includes a pair of pivoting holes 163 defined therein near a rear edge thereof, and a pair of posts 165 extending perpendicularly outward from a same side adjacent to the pivoting holes 163 toward the other partitioning panel 16. A pair of engaging portions 167 respectively extends from the rear edges of the partitioning panels 16 towards each other. A through hole 1674 is defined in each of the engaging portions 167.

Figure 4:
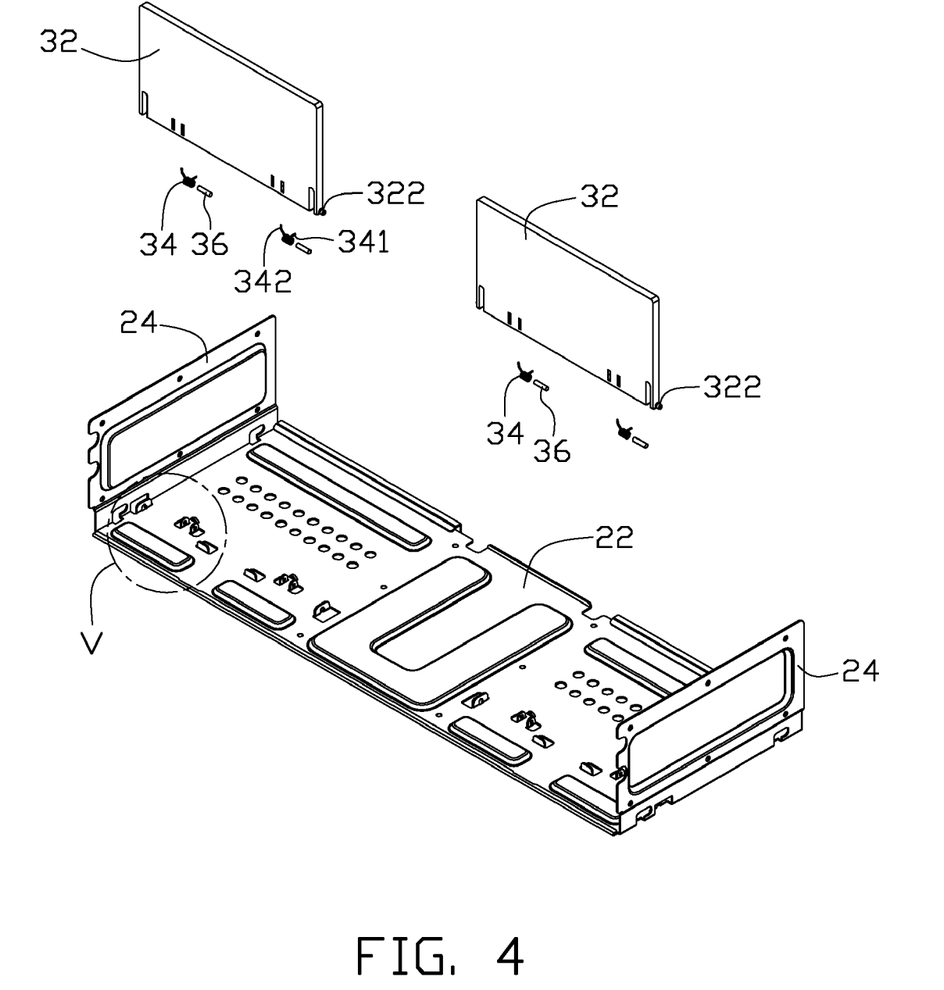
FIG. 4 is an enlarged view of the mounting bracket and the first air flap apparatuses of FIG. 1, but viewed from another aspect.
Figure 5:
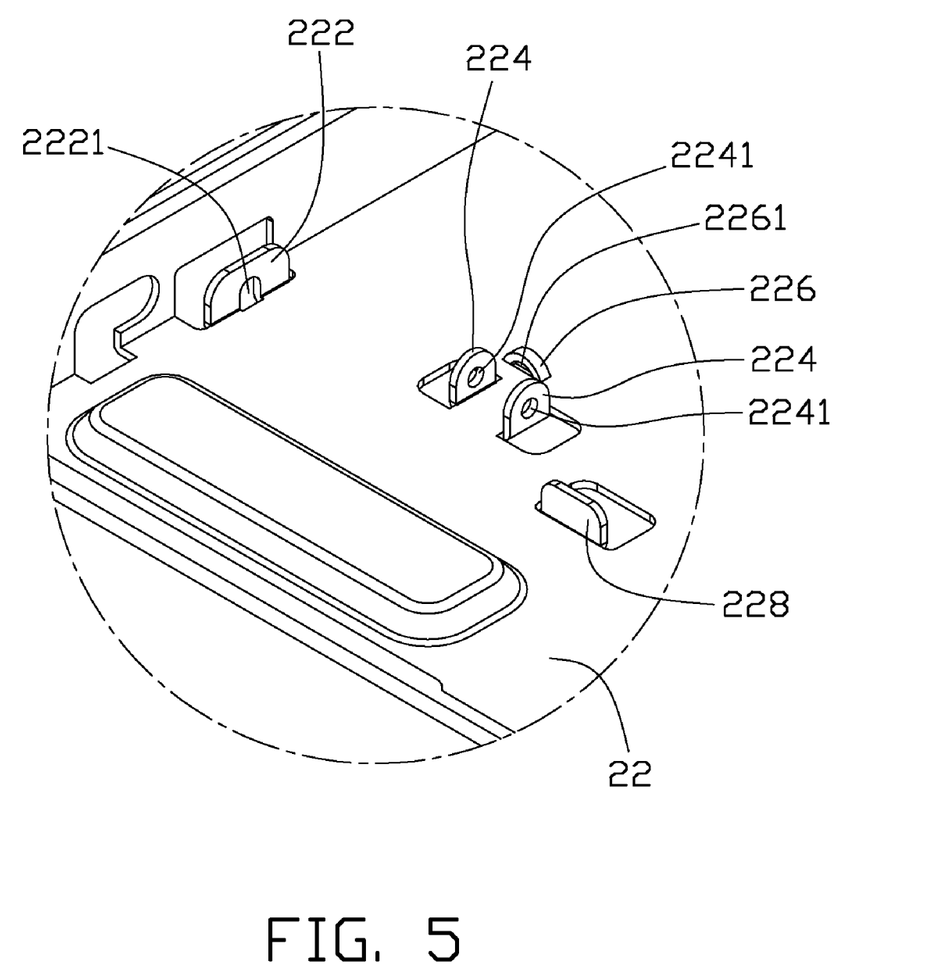
FIG. 5 is an enlarged view of an encircled portion V of FIG. 4.

Referring also to FIGS. 4 and 5, the mounting bracket 20 includes a top wall 22 and a pair of sidewalls 24 vertically extending down from opposite side edges of the top wall 22. The top wall 22 includes a pair of mounting mechanisms configured for correspondingly engaging with the first air flap apparatuses 30. Each mounting mechanism includes a pair of first tabs 222, two pairs of second tabs 224, a pair of locating portions 226 and a pair of blocks 228 extending down from the top wall 22. The second tabs 224, the locating portions 226, and the blocks 228 are arranged between the first tabs 222. A pivoting hole 2221 is defined in each first tab 222. A fixing hole 2241 is defined in each second tab 224. A snapping hole 2261 is defined in each locating portion 226.

Each first air flap apparatus 30 includes a shielding panel 32, a pair of torsion springs 34, and a pair of shafts 36 for passing through the torsion springs 34. Each shielding panel 32 includes a pair of pivoting portions 322 respectively extending from top ends of opposite side edges thereof. A pair of arms 341, 342 respectively extends from opposite ends of each torsion spring 34.

Figure 6:
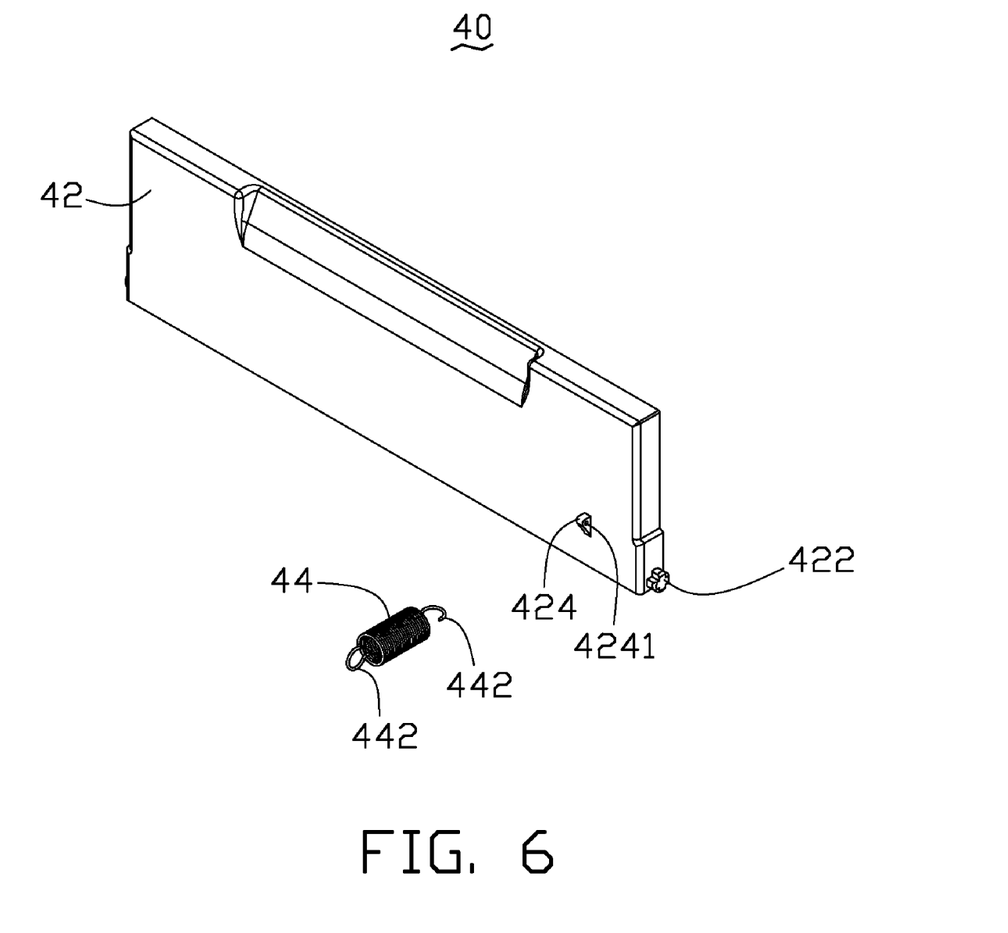
FIG. 6 is an enlarged view of the second air flap apparatuses of FIG. 1.

Referring also to FIG. 6, each second air flap apparatus 40 includes a shielding panel 42 with a pair of pivoting portions 422 respectively extending from ends of opposite edges thereof, and a coil spring 44 attached to the shielding panel 42. A protruding portion 424 is formed on a side surface of the shielding panel 40 with a connecting hole 4241 defined therein. The coil spring 44 includes a pair of hooks 442 defined at opposite ends thereof.

Figure 7:
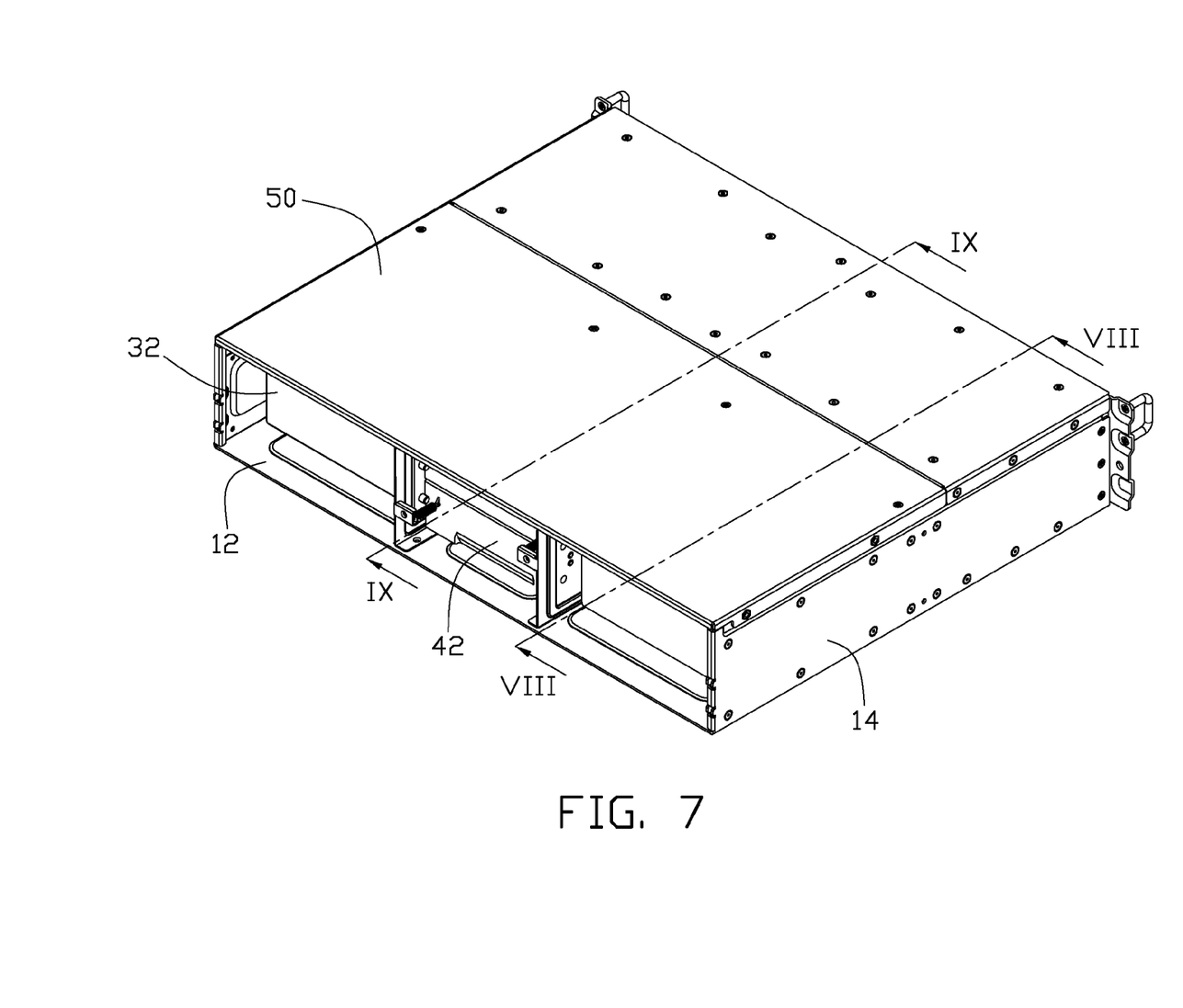
FIG. 7 is an assembled view of the server chassis of FIG. 1.
Figure 8:
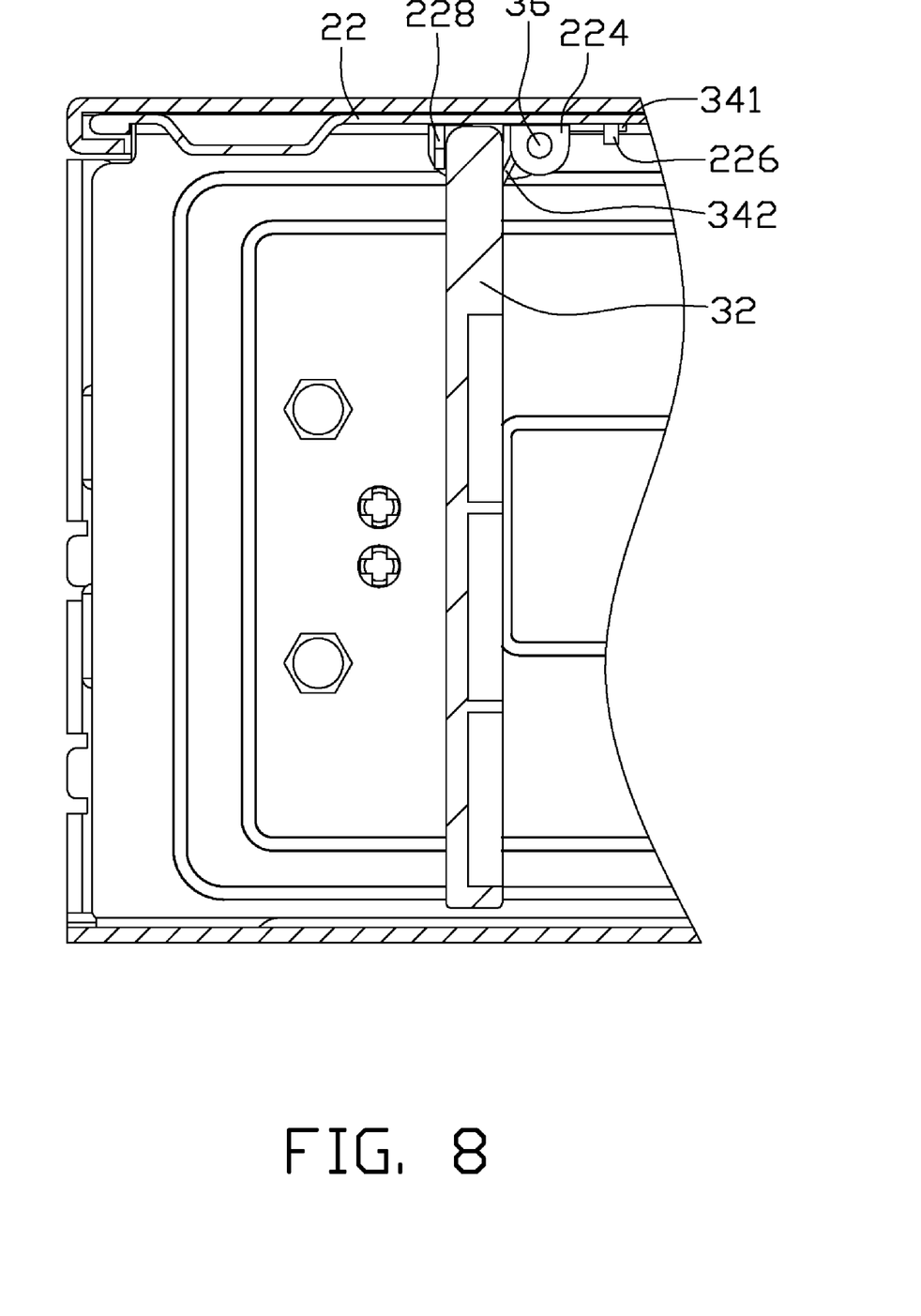
FIG. 8 is an enlarged sectional view taken along line VIII-VIII of FIG. 7.
Figure 9:
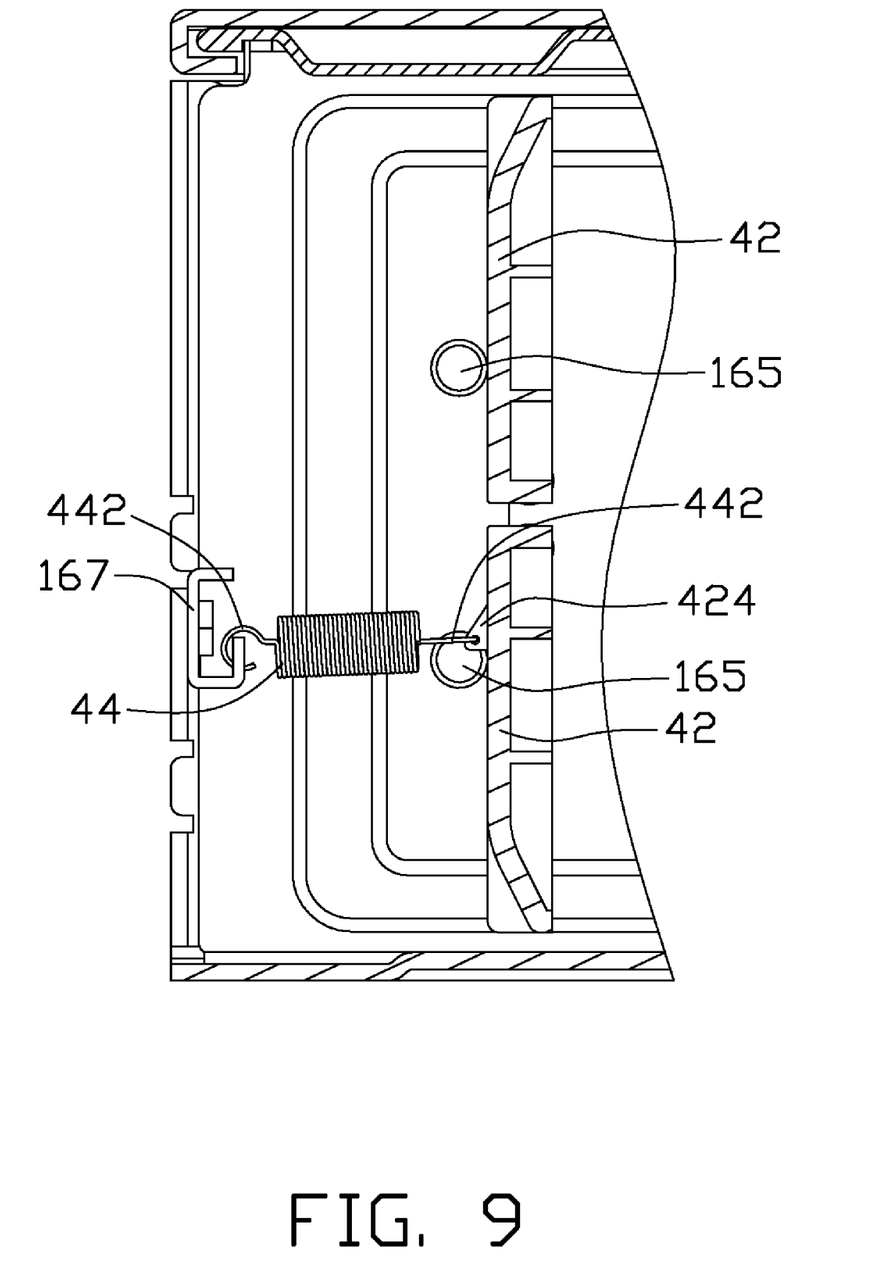
FIG. 9 is an enlarged sectional view taken along line IX-IX of FIG. 7.

Referring also to FIGS. 7, 8 and 9, in assembly, each air flap apparatus 30 is mounted to the mounting bracket 20 in a way as described herebelow: Each shaft 36 passes through the corresponding torsion spring 34, then, the shafts 36 are respectively snappingly engaged in the fixing holes 2241 of the second tabs 224 of the mounting bracket 20. The arms 341 of the corresponding torsion springs 34 are fixed in the snapping holes 2261 of the locating portions 226 of the mounting bracket 20. The pivoting portions 322 of the shielding panel 32 are pivotably received in the pivoting holes 2221 of the corresponding first tabs 222 of the mounting bracket 20. The arms 342 of the torsion springs 34 abut against the outside surface of the shielding panel 32. The blocks 228 abut against the inside surface of the shielding panel 32.

Each second air flap apparatus 40 is mounted to the base 10 in a way as described below. The pivoting portions 422 of the shielding panel 42 are pivotably received in the pivoting holes 163 of the corresponding partitioning panels 16 of the base 10. The hooks 442 of the coil spring 44 are respectively engaged in the through hole 1674 of the engaging portion 167 of the partitioning panel 16 and the connecting hole 4241 of the portion 424 of the shielding panel 42. The shielding panel 42 is pulled by the coil spring 44 to abut against the post 165 of the corresponding partitioning panel 16.

The mounting bracket 20 is secured to the base 10 with the sidewalls 24 respectively in tight contact with inside surfaces of the side panels 14 of the base 10. The first air flap apparatuses 30 are respectively disposed between the sidewalls 24 of the mounting bracket 20 and a corresponding one of the partitioning panels 16. Finally, the cover 50 is disposed on the mounting bracket 20.

When a first functional module 100 is pushed into the server chassis through one of the openings shielded by one first air flap apparatus 30, the shielding panel 32 of the air flap apparatus 30 is urged to pivot about the pivoting portions 322 thereof. Thus, the opening is exposed. The arms 342 of the torsion springs 34 of the air flap apparatus 30 are urged to move towards the corresponding arms 341 so that the torsion springs 34 are deformed. When a second functional module 200 is pushed into the server chassis through an opening shielded by a second air flap apparatus 40, the shielding panel 42 of the air flap apparatus 40 is urged to pivot about the pivoting portions 422 thereof. Therefore the opening is exposed. The coil spring 44 is elongated and deformed.

When the first functional module 100 is drawn out of the server chassis to move away from the shielding panel 32 of the first air flap apparatus 30, the corresponding torsion springs 30 are restored and the arms 342 urge the shielding panel 32 to pivot outwards until the shielding panel 32 abuts against the corresponding blocks 228 of the mounting bracket 20. Thus, the corresponding opening is shielded by the shielding panel 32. When a second functional module 200 is drawn out of the sever chassis to move away from the second air flap apparatus 40, the corresponding coil spring 44 is restored and the shielding panel 42 is pulled to pivot outwards until the shielding panel 42 abuts against the corresponding posts 165 of the partitioning panels 16. Thus, the corresponding opening is shielded by the shielding panel 42.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A server chassis for receiving a functional module therein, the server chassis comprising:

a base comprising a bottom panel and a pair of parallel partitioning panels extending up from the bottom panel, wherein the base defines a space between the partitioning panels to receive the functional module, an opening defined in an end of the base for the functional module being inserted into the space, each of the partitioning panels defines a pivoting hole adjacent to the opening; and an air flap apparatus engaging with the base, the air flap apparatus comprising a shielding panel pivotably attached to the base, and a resilient member connected to the base and the shielding panel respectively for urging movement of the shielding panel, wherein the shielding panel comprises a pair of pivoting portions respectively extending from opposite lateral edges of the shielding panel and configured for being pivotably received in the pivoting holes of the partitioning panels respectively.

2. The server chassis as described in claim 1, wherein the resilient member is a coil spring with a pair of hooks respectively formed at opposite ends thereof for being engaged with the shielding panel and one of the partitioning panels.

3. The sewer chassis as described in claim 2, wherein at least one partitioning panel comprises an engaging portion formed thereon with a through hole defined therein for engaging with one of the hooks of the resilient member, the shielding panel forms a protruding portion with a connecting hole defined therein for engaging with the other hook of the resilient member.

4. The server chassis as described in claim 1, wherein at least one of the partitioning panels comprises a post extending therefrom for abutting against the shielding panel.

5. A server chassis for receiving a functional module therein, the server chassis comprising:

a base with an opening defined in an end thereof for the functional module inserted therethrough;

a mounting bracket installed to the base, and comprising a top wall forming a air of first tabs respectively defining a pivoting hole; and an air flap apparatus comprising a shielding panel pivotably attached to the mounting bracket, and at least one resilient member arranged between the mounting bracket and the shielding panel, wherein the shielding panel comprises a pair of pivoting portions respectively extends from opposite lateral edges of the shielding panel configured to be pivotably received in the pivoting holes of the first tabs respectively.

6. The server chassis as described in claim 5, wherein the resilient member is a torsion spring, a pair of second tabs extending from the top wall of the mounting bracket and is arranged between the first tabs, a pair of fixing holes is defined in the second tabs respectively, a shaft passes through the resilient member and the opposite ends of the shaft are secured in the fixing holes of the second tabs correspondingly.

7. The server chassis as described in claim 6, wherein the mounting bracket further comprises a locating portion extending from the top wall thereof, a pair of snapping holes is respectively defined in the locating portions, the resilient member forms a pair of arms respectively snapped in the snapping holes and resisting against the shielding panel.

8. The server chassis as described in claim 7, wherein a block perpendicularly extends from the top wall of the mounting bracket for abutting against the shielding panel.

* * * * *